US008717805B2

(12) United States Patent
Kajigaya (10) Patent No.: US 8,717,805 B2
(45) Date of Patent: May 6, 2014

(54) NONVOLATILE RAM

(71) Applicant: Elpida Memory, Inc., Tokyo (JP)

(72) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/862,221

(22) Filed: Apr. 12, 2013

(65) Prior Publication Data

US 2013/0229870 A1     Sep. 5, 2013

Related U.S. Application Data

(63) Continuation of application No. 12/071,052, filed on Feb. 14, 2008, now Pat. No. 8,437,188.

(30) Foreign Application Priority Data

Feb. 22, 2007    (JP) ................................. 2007-042230

(51) Int. Cl.
     *G11C 11/00*      (2006.01)
(52) U.S. Cl.
     USPC ......................................... 365/148; 365/158
(58) Field of Classification Search
     USPC .................... 365/185.08, 148, 158
     See application file for complete search history.

(56) References Cited

U.S. PATENT DOCUMENTS

| | | | | |
|---|---|---|---|---|
| 7,349,238 | B2 * | 3/2008 | Gohou | 365/145 |
| 7,391,643 | B2 * | 6/2008 | Fuji | 365/163 |
| 2003/0212871 | A1 * | 11/2003 | Suzuki et al. | 711/164 |
| 2005/0007953 | A1 | 1/2005 | Hirose et al. | |
| 2006/0007727 | A1 * | 1/2006 | Harrison et al. | 365/147 |
| 2009/0059641 | A1 * | 3/2009 | Jeddeloh | 365/63 |

FOREIGN PATENT DOCUMENTS

| | | |
|---|---|---|
| JP | 09-008247 A | 1/1997 |
| JP | 10-021689 A | 1/1998 |
| JP | 2001-014871 A | 1/2001 |
| JP | 2001-057085 A | 2/2001 |
| JP | 2004-296076 A | 10/2004 |
| JP | 2008-526008 A | 7/2008 |
| WO | WO 2006/070151 A1 | 7/2006 |

OTHER PUBLICATIONS

Japanese Office Action dated Jan. 31, 2012 with an English translation.

* cited by examiner

*Primary Examiner* — Anthan Tran
(74) *Attorney, Agent, or Firm* — McGinn IP Law Group, PLLC (57) ABSTRACT

A semiconductor random access memory device includes a memory cell including a resistor whose resistance varies by formation and disappearance of a filament due to an oxidation-reduction reaction of metal ions, a memory area configured to include a first memory area operable in a nonvolatile mode in which a stored content thereof is not lost by a power-off event, and a second memory area operable in a volatile mode in which the stored content thereof is lost by the power-off event, each of the first memory area and the second memory area including the plurality of the memory cells, a register circuit that stores information including a first address information indicating the first memory area, and a second address information indicating the second memory area, and a control circuit that controls the nonvolatile mode, and the volatile mode, with reference to the information stored in the register circuit.

24 Claims, 10 Drawing Sheets

NONVOLATILE RAM

RELATED APPLICATIONS

This Application is a Continuation Application of U.S. patent application Ser. No. 12/071,052, filed on Feb. 14, 2008, which, in turn, claims priority to Japanese Patent Application 2007-042230, filed on Feb. 22, 2007.

BACKGROUND OF THE INVENTION

1. Field of the Invention

The present invention relates to nonvolatile memory such as nonvolatile random-access memory (RAM), whose data are not lost irrespective of power-off events and which can be accessed in a random manner.

This application claims priority on Japanese Patent Application No. 2007-42230, the content of which is incorporated herein by reference.

2. Description of the Related Art

Conventionally, various types of nonvolatile memory such as flash memory (e.g., read-only memory (ROM) reloadable by user on board) have been known. For example, Japanese Unexamined Patent Application Publication No. 2001-14871 teaches a flash memory having security and protection functions.

Figure 10:
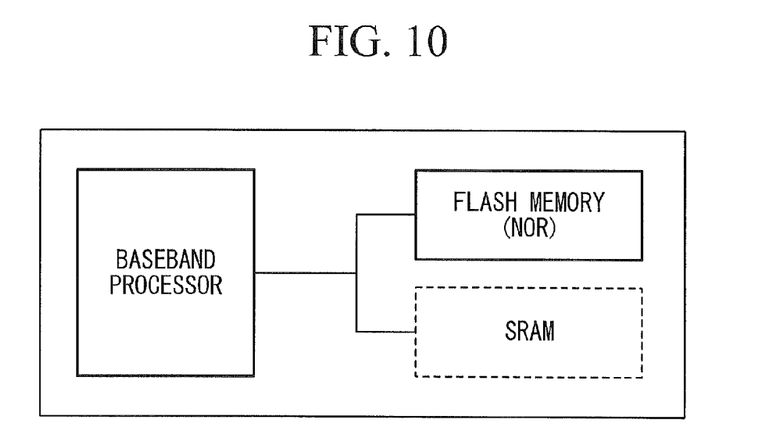
FIG. 10 is a block diagram showing the basic constitution of a conventionally-known cellular phone using a flash memory serving as NOR.
Figure 11:
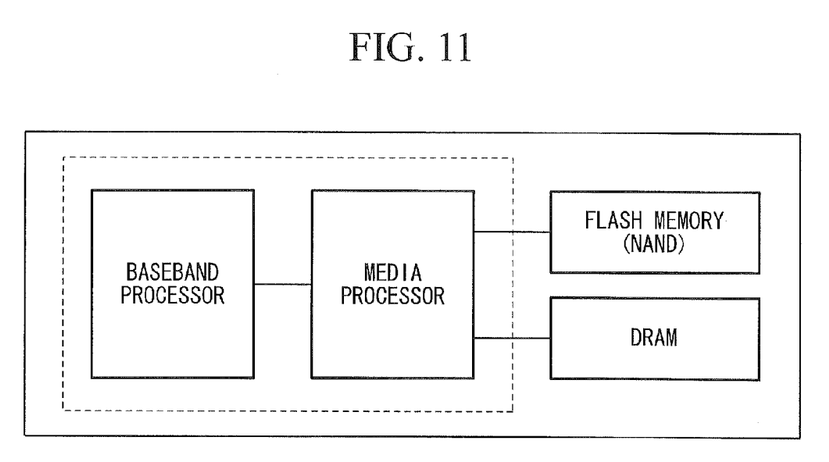
FIG. 11 is a block diagram showing the basic constitution of a conventionally-known cellular phone using a flash memory serving as NAND.

In general, in the computer system adapted to cellular phones as shown in FIGS. 10 and 11, program codes are stored on hard disks or reloadable ROM such as flash memory in connection with processors, wherein program codes are loaded into and executed by volatile memory such as static random-access memory (SRAM) and dynamic random-access memory (DRAM).

The aforementioned computer system needs multiple storage media, which in turn increase the size of electronic devices; hence, it is very difficult to apply them to portable small-size electronic devices such as cellular phones.

It may be effective for portable small-size electronic devices to incorporate the system in which program codes are stored in reloadable ROM such as electronically erasable and programmable read-only memory (EEPROM) and flash memory so as to perform processing in accordance with programs, wherein nonvolatile memory such as static random-access memory (SRAM) and dynamic random-access memory (DRAM) serves as a work area for storing intermediate data produced during execution of processing.

However, the aforementioned system needs multiple memory chips, which in turn increase the packaging space or mounting area so as to increase the manufacturing cost. For this reason, it is required to further reduce the size of the system and to further downsize the system.

In order to further reduce the size of the system, it is necessary to reduce the number of memory chips included in portable small-size electronic devices.

It is possible to divide the overall storage area of a reloadable ROM into two areas, i.e., an area defined by a certain range of address for storing program codes and a work area defined by another address. This allows the system to be realized using a single memory chip.

In order to reload data after being erased from the reloadable ROM, ROM may need a relatively long write time than DRAM or SRAM, which makes it impossible to perform random access, thus making the work area unusable.

Magnetoresistive random-access memory (MRAM) may be equivalent to DRAM in terms of the write time; however, MRAM is bigger than DRAM in the chip size thereof so that it cannot be suited to memory having a large storage capacity.

SUMMARY OF THE INVENTION

It is an object of the present invention to provide a nonvolatile RAM serving as a single memory chip having a small chip size, which includes a work area frequently accessed by an application and another area for storing program codes.

In a first aspect of the present invention, a nonvolatile RAM for reading and writing data in a random manner includes a memory area configured by a plurality of memory cells suited to a nonvolatile-mode write operation, in which the stored content thereof is not lost irrespective of a power-off event, and a volatile-mode write operation, in which the stored content thereof is lost in the power-off event, a register for setting a first address adapted to the nonvolatile-mode write operation and a second address adapted to the volatile-mode write operation, and a control circuit for performing the nonvolatile-mode write operation with reference to the first address or for performing the volatile-mode write operation with reference to the second address.

In the above, the control circuit sets a larger amount of electric charge supplied to the memory cells in connection with the nonvolatile-mode write operation compared to the volatile-mode write operation.

The control circuit refreshes the memory cells subjected to the volatile-mode write operation by a prescribed period.

Program codes are written by way of the nonvolatile-mode write operation with reference to the first address, while the second address enabling the volatile-mode write operation is used as a work area within the memory area.

Each of the memory cells is formed using a solid electrolyte so that it is varied in resistance by way of oxidation and reduction of metal ions due to electric charge supplied to the solid electrolyte.

The memory area adapted to the nonvolatile-mode write operation at the first address is subjected to write protection for inhibiting new data from being further written in a write-protect region.

The aforementioned nonvolatile RAM further includes a write-protect region setting register for setting the first address designating the write-protect region, and a comparison circuit for comparing an input address and the first address of the write-protect region, wherein the control circuit stops performing the write operation when the comparison circuit indicates that the input address belongs to the first address, while the control circuit proceeds to the write operation when the comparison circuit indicates that the input address does not belong to the first address.

The memory area adapted to the nonvolatile-mode write operation at the first address is subjected to write protection for inhibiting new data from being further written in a write-protect region, into which the program codes are written, so that the work area is defined by excluding the write-protect region from the memory area.

In the above, the control circuit informs an external device of reception of a write instruction directed to the write-protect region.

In a second aspect of the present invention, a computer system includes a nonvolatile RAM for reading and writing data in a random manner and a processor, wherein the nonvolatile RAM has a memory area configured by a plurality of memory cells all formed on a single substrate and suited to a nonvolatile-mode write operation, in which the stored content thereof is not lost irrespective of a power-off event, and a volatile-mode write operation, in which the stored content thereof is lost in the power-off event, wherein the nonvolatile-mode write operation and the volatile-mode write operation are selectively performed in connection with a first portion and a second portion of the memory area, and wherein the processor executes program codes stored in the first portion of the memory area adapted to the nonvolatile-mode write operation while using the second portion of the memory area adapted to the volatile-mode write operation as a work area.

In the above, the first portion of the memory area adapted to the nonvolatile-mode write operation is subjected to write protection for inhibiting new data from being further written in a write-protect region.

In a third aspect of the present invention, a control method adapted to a computer system includes a nonvolatile RAM for reading and writing data in a random manner and a processor, wherein the nonvolatile RAM has a memory area configured by a plurality of memory cells all formed on a single substrate and suited to a nonvolatile-mode write operation, in which the stored content thereof is not lost irrespective of a power-off event, and a volatile-mode write operation, in which the stored content thereof is lost in the power-off event. In accordance with the control method, the processor executes program codes stored in a first portion of the memory area subjected to the nonvolatile-mode write operation while using a second portion of the memory area adapted to the volatile-mode write operation as a work area.

Alternatively, a control method adapted to a computer system includes a nonvolatile RAM for reading and writing data in a random manner and a processor, wherein the nonvolatile RAM has a memory area configured by a plurality of memory cells all formed on a single substrate and suited to a nonvolatile-mode write operation, in which the stored content thereof is not lost irrespective of a power-off event, and a volatile-mode write operation, in which the stored content thereof is lost in the power-off event, and wherein the first portion of the memory area adapted to the nonvolatile-mode write operation is subjected to write protection for inhibiting new data from being further written in a write-protect region. In accordance with the control method, the processor executes program codes stored in a first portion of the memory area subjected to the nonvolatile-mode write operation while using a second portion of the memory area adapted to the volatile-mode write operation as a work area.

In a fourth aspect of the present invention, a semiconductor device includes a nonvolatile RAM for reading and writing data in a random manner and a processor, wherein the nonvolatile RAM has a memory area configured by a plurality of memory cells all formed on a single substrate and suited to a nonvolatile-mode write operation, in which the stored content thereof is not lost irrespective of a power-off event, and a volatile-mode write operation, in which the stored content thereof is lost in the power-off event, wherein the nonvolatile-mode write operation and the volatile-mode write operation are selectively performed in connection with a first portion and a second portion of the memory area, and wherein the processor executes program codes stored in the first portion of the memory area adapted to the nonvolatile-mode write operation while using the second portion of the memory area adapted to the volatile-mode write operation as a work area. Both the nonvolatile RAM and the processor are laminated together in a single package.

Alternatively, a semiconductor device includes a nonvolatile RAM for reading and writing data in a random manner and a processor, wherein the nonvolatile RAM has a memory area configured by a plurality of memory cells all formed on a single substrate and suited to a nonvolatile-mode write operation, in which the stored content thereof is not lost irrespective of a power-off event, and a volatile-mode write operation, in which the stored content thereof is lost in the power-off event, wherein the first portion of the memory area adapted to the nonvolatile-mode write operation is subjected to write protection for inhibiting new data from being further written in a write-protect region, and wherein the processor executes program codes stored in a first portion of the memory area adapted to the nonvolatile-mode write operation while using a second portion of the memory area adapted to the volatile-mode write operation as a work area. Both the nonvolatile RAM and the processor are laminated together in a single package.

As described above, the present invention offers the following effects.

The aforementioned nonvolatile RAM is designed to store fixed data such as program codes and table data, which are not necessarily changed, in the first portion of the memory area subjected to the nonvolatile-mode write operation while using the second portion of the memory area (serving as the work area) subjected to the volatile-mode write operation at a high speed. That is, the nonvolatile RAM of the present invention shares the program code storage area and the work area. This allows the computer system to use a single nonvolatile RAM for storing program codes and data; hence, it is possible to reduce the manufacturing cost and to downsize the system.

In addition, the nonvolatile RAM also includes the hardware for realizing write protection for inhibiting new data from being further written in a write-protect region upon reception of a wrong write instruction directed to the write-protect region by means of the control circuit, which in turn forwards it to an external device (e.g., a processor). This prevents the fixed data (which should not be modified) from being unexpectedly reloaded or changed due to execution of wrong program codes. In addition, the control circuit forwards the wrong write instruction to the processor so as to prevent wrong write operations from being performed on the nonvolatile RAM.

BRIEF DESCRIPTION OF THE DRAWINGS

These and other objects, aspects, and embodiments of the present invention will be described in more detail with reference to the following drawings, in which.

DESCRIPTION OF EMBODIMENTS OF THE INVENTION

The present invention will be described in further detail by way of examples with reference to the accompanying drawings.

1. Overall Constitution of Nonvolatile RAM

Figure 1:
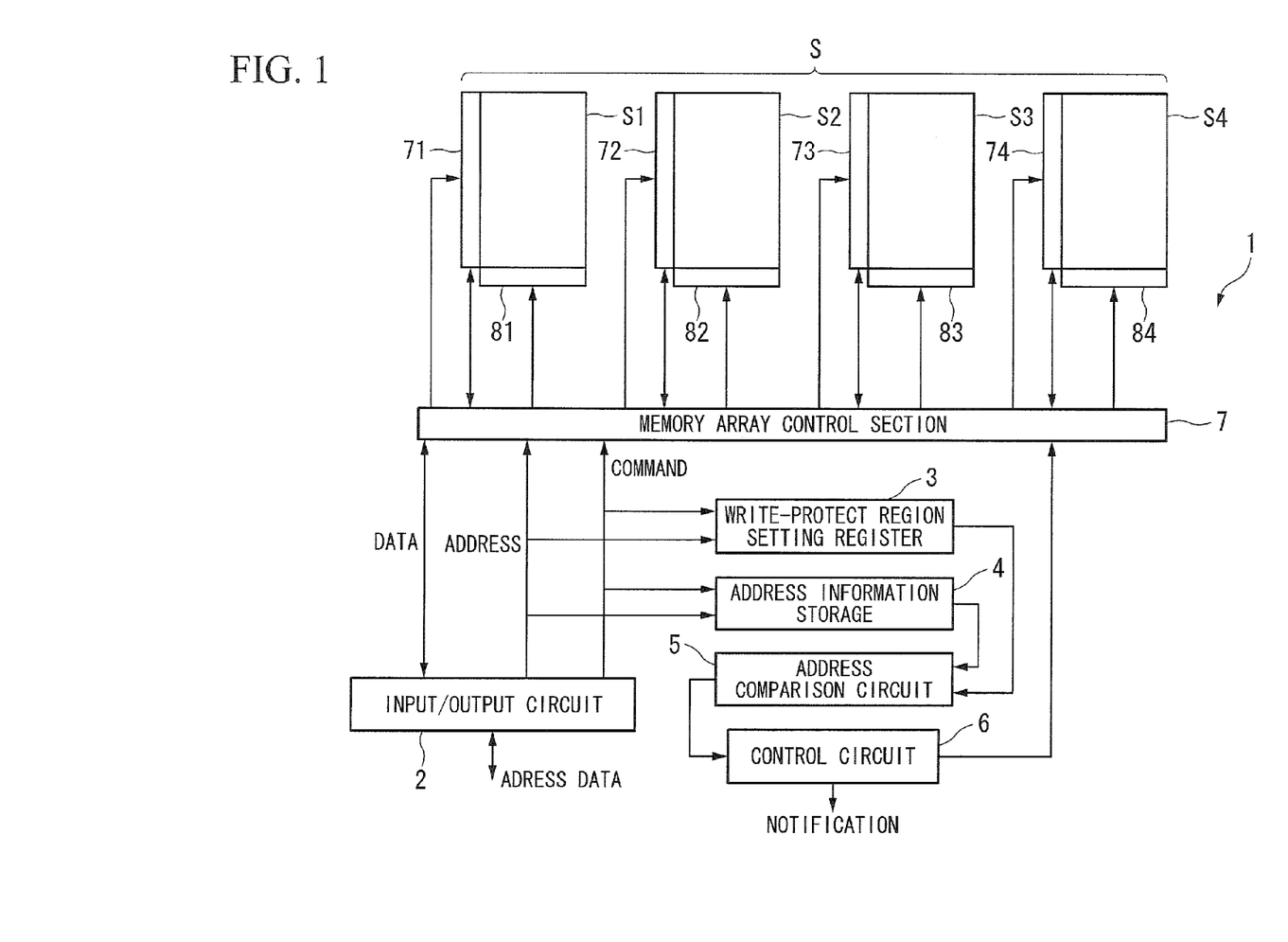
FIG. 1 is a block diagram showing the overall constitution of a nonvolatile RAM in accordance with a preferred embodiment of the present invention.

A nonvolatile RAM 1 according to a preferred embodiment of the present invention will be described with reference to the accompanying drawings. FIG. 1 is a block diagram showing the overall constitution of the nonvolatile RAM 1.

The nonvolatile RAM 1 of FIG. 1 includes an input/output circuit 2, a write-protect region setting register 3, an address information storage 4, an address comparison circuit 5, a control circuit 6, a memory array control section 7, column decoders 71 to 74, row decoders 81 to 84, and a memory area S.

The input/output circuit 2 performs input processing on data, commands, addresses, and it also performs output processing on data read from memory cells (or memory elements).

The memory area S is divided into plural areas, i.e., four memory arrays S1, S2, S3, and S4.

The address information storage 4 stores nonvolatile data address information designating a certain range of address (or a desired memory array) within an address space, thus forming a nonvolatile data region defined by the designated addresses so as to perform nonvolatile-mode write operation. That is, the memory area S of the nonvolatile RAM 1 secures two write characteristics, namely, the nonvolatile data region, which is designated by the nonvolatile data address information stored in the address information storage 4, and a volatile data region, which is designated by another address so as to secure volatile-mode write operation.

The address information storage 4 sets the nonvolatile data address information designating the nonvolatile data region with reference to command and address input by the input/output circuit 2, wherein the command designates the setting of the nonvolatile data region.

The nonvolatile-mode write operation has storage characteristics similar to those of flash memory and EEPROM, in which data stored in memory cells are retained irrespective of power-off events.

In contrast, the volatile-mode write operation has characteristics (similar to those of DRAM and SRAM), in which data stored in memory cells are lost in power-off events, and characteristics (similar to those of DRAM), in which data stored in memory cells are lost without refresh.

Therefore, program codes, which should not be lost in a power-off event, are stored in the nonvolatile data region. Data are written into memory cells with respect to the volatile data region with a short write time, which is shorter than the write time required for the nonvolatile data region similar to DRAM and SRAM; hence, the volatile data region serves as a work area for temporarily storing intermediate data during execution of processing.

The write-protect region setting register 3 stores write-protect address information designating a certain range of address (or a desired memory array) within the address space so as to inhibit write operation from being performed on a write-protect region. The write-protect region stores important data and program codes, which should not be modified. When the write-protect region setting register 3 sets the write-protect address information, it detects whether or not identification information included in the input command matches preset identification information, which is preset in advance; then, when a match is detected, it uses the input address accompanied with the input command for the write-protect address information, whereas when a match is not detected, it stops setting the write-protect address information.

When the write-protect region setting register 3 deletes or changes the write-protect address information, it detects whether or not identification information included in the input command regarding a change instruction matches the preset identification information; then, when a match is detected, it uses the input address accompanied with the input command for the write-protect address information, or it deletes the input address, whereas when a match is not detected, it does not perform a change process with regard to the write-protect address information.

When the address comparison circuit 5 detects that the input address belongs to the write-protect address information, it outputs a write-protect control signal to the control circuit 6, whereas when it detects that the input address does not belong to the write-protect address information, it stops outputting the write-protect control signal.

It is possible for the write-protect region setting register 3 to set a certain range of address defined between a start address and an end address, wherein a range of address of the memory array S1 (or a range of addresses lying over multiple memory arrays) is registered as the write-protect address information, so that the address comparison circuit 5 detects whether or not the input address belongs to such a range of address.

It is possible for the write-protect region setting register 3 to set a range of address corresponding to the write-protect address information in units of memory arrays, wherein the address comparison circuit 5 detects whether or not the input address belongs to the memory array.

When the input command (input by the input/output circuit 2) is a write instruction, the address comparison circuit 5 detects whether or not the input address accompanied with the write instruction belongs to the nonvolatile data address information stored in the address information storage 4.

When the input address belongs to the nonvolatile data address information, the address comparison circuit 5 outputs a nonvolatile-mode signal to the control circuit 6. When the input address does not belong to the nonvolatile data address information, the address comparison circuit 5 stops outputting the nonvolatile-mode signal.

It is possible for the address information storage 4 to set a certain range of address defined between a start address and an end address, wherein a range of address of the memory array S1 (or a range of addresses lying over plural memory arrays) is stored as the nonvolatile data address information, so that the address comparison circuit 5 detects whether or not the input address belongs to such a range of address.

It is possible for the address information storage 4 to set a range of address corresponding to the write-protect address information in units of memory arrays, wherein the address comparison circuit 5 detects whether or not the input address belongs to the memory array.

Upon reception of the write-protect control signal, the control circuit 6 outputs a write-protect signal to the memory array control section 7, wherein the control circuit 6 also outputs an abnormal access signal so as to inform an external processor and the like of write access occurring in the range of address designated by the write-protection address information.

Upon reception of the nonvolatile-mode signal, the control circuit 6 outputs a nonvolatile write signal to the memory array control section 7.

In accordance with procedures of read/write operations designated by the input command, the memory array control section 7 performs read/write operations on data in association with memory cells included in the memory arrays S1 to S4, which are designated by the input address.

Upon reception of the write-protect signal, the memory array control section 7 stops performing the write operation with regard to the corresponding address, so that no data is written into memory cells.

Upon reception of the nonvolatile write signal, the memory array control section 7 performs a nonvolatile-mode write operation on data in association with memory cells designated by the corresponding address. The memory array control section 7 has a refresh function therein, whereby, with reference to the nonvolatile data address information stored in the address information storage 4, it performs a refresh operation on memory cells subjected to a volatile-mode write operation in a prescribed period; in other words, it performs a volatile-mode reloading process with regard to written data.

All the memory cells included in the memory arrays S1 to S4 are arranged in a matrix form defined by column and row.

The column decoders 71 to 74 select memory cells in units of columns within the memory arrays S1 to S4 in response to a column address designated by the memory array control section 7.

The row decoders 81 to 84 select memory cells in units of rows within the memory arrays S1 to S4 in response to a row address designated by the memory array control section 7.

Thus, it is possible to perform read/write operations on data with respect to memory cells positioned at the intersecting points between columns and rows.

Figure 2:
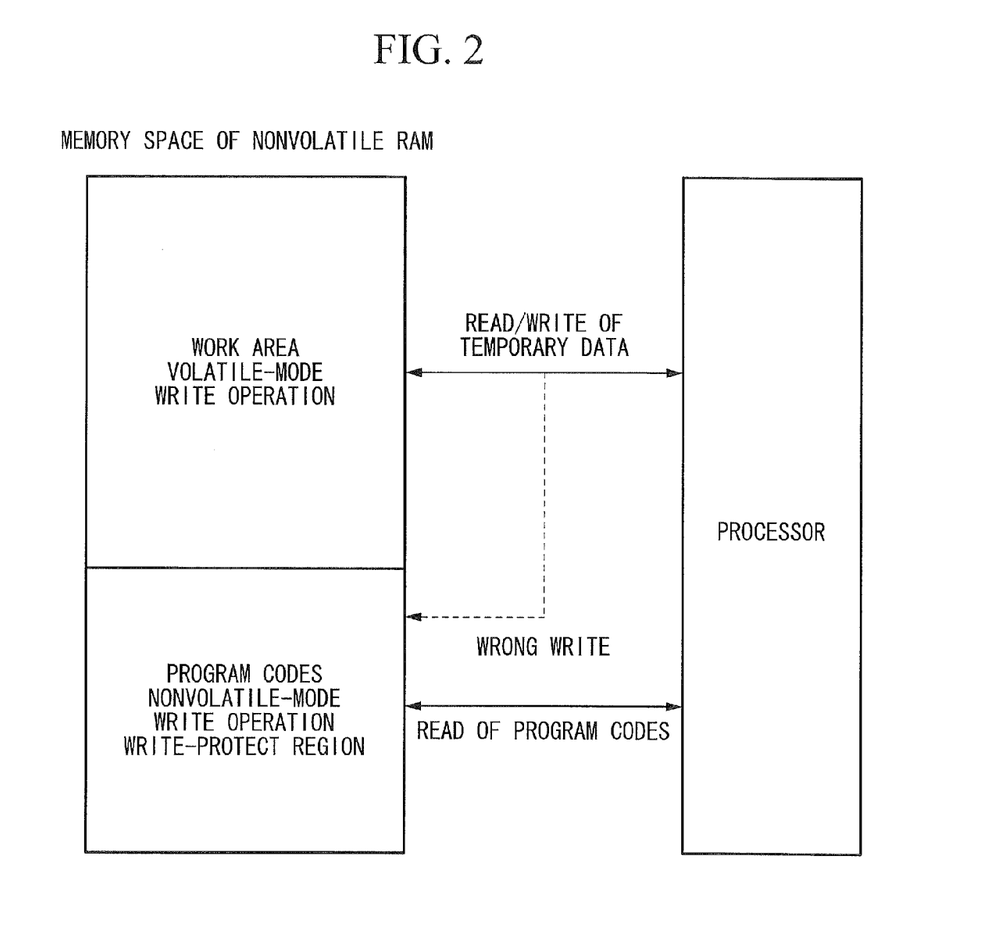
FIG. 2 is a conceptual illustration showing that the overall storage area of the nonvolatile RAM is divided into a work area enabling a volatile-mode write operation and a program storage area enabling a nonvolatile-mode write operation.

Due to the aforementioned constitution, as shown in FIG. 2, the overall storage area of the nonvolatile RAM 1 can be arbitrarily divided into a work area enabling a volatile-mode write operation and random access and a program storage area (or an important data storage area) enabling a nonvolatile-mode write operation. In addition, it is possible to set write-protect programs from being mistakenly or incorrectly reloaded into the nonvolatile-mode region.

2. Detailed Constitution of Nonvolatile RAM

Figure 3:
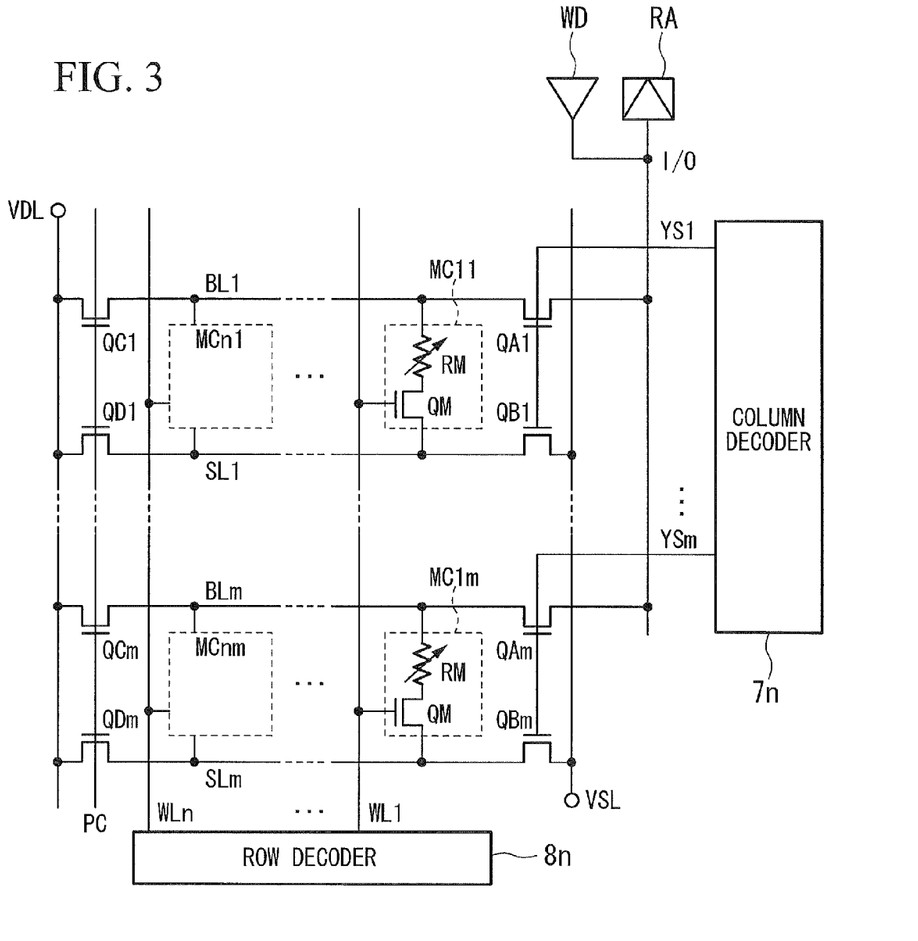
FIG. 3 is a circuit diagram showing a memory array including memory cells within the nonvolatile RAM.
Figure 4:
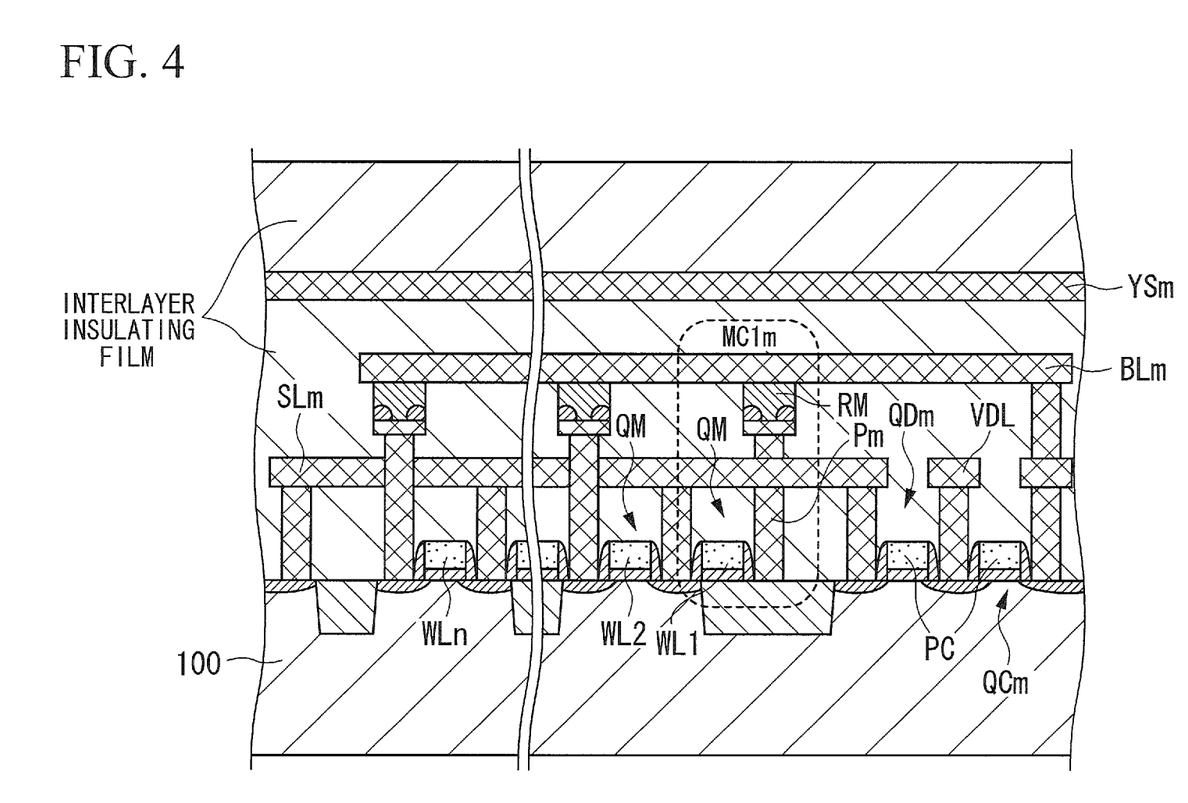
FIG. 4 is a sectional view showing the internal constitution of the nonvolatile RAM including a memory cell and its peripheral portions.

Next, memory cells of resistance-variable types using solid electrolytes, which are applied to the nonvolatile RAM 1 of the present invention, will be described with reference to FIGS. 3 and 4. FIG. 3 is a circuit diagram diagrammatically showing a memory array of the nonvolatile RAM 1 having a large capacity. FIG. 4 is a sectional view showing the internal constitution of the nonvolatile RAM 1 in connection with memory cells of resistance-variable types and peripheral portions. Each memory cell of the resistance-variable type is configured by connecting a resistor RM composed of a solid electrolyte whose resistance varies due to a current flowing therethrough and an N-channel MOS transistor QM. The resistor RM is formed between the drain of the MOS transistor QM and a bit line BL.

In FIGS. 3 and 4, the resistor RM forms a nonvolatile memory cell whose resistance varies by way of the formation and disappearance of a filament due to an oxidation-reduction reaction of metal ions within the solid electrolyte.

That is, the resistor RM is configured such that a solid electrolyte is sandwiched between a titanium electrode and a copper electrode, wherein due to movement of atoms (ions: $Cu^+$) within the solid electrolyte (e.g., copper sulfide, $Cu_2S$), a negative voltage (or a negative charge) is applied between the titanium electrode and the copper electrode so as to cause oxidation (at the interface between the solid electrolyte and the titanium electrode) and reduction (at the interface between the titanium electrode and the solid electrolyte), thus forming a metal bridge in the solid electrolyte, by which the resistor RM is turned on with a low resistance. When a positive voltage (or a positive charge) is applied between the titanium electrode and the copper electrode, a reverse reaction occurs with respect to the oxidation (at the interface between the titanium electrode and the solid electrolyte) and the reduction (at the interface between the solid electrolyte and the titanium electrode), thus making the metal bridge disappear, so that the resistor RM is turned off with a high resistance.

In the circuitry of FIG. 3, memory cells MC (representing MC11 to MC1$m$, . . . , MC$n$1 to MC$nm$) are arranged in a matrix form and are connected with row-select signal lines WL (representing WL1 to WL$n$), column-select signal lines YS (representing YS1 to YS$m$), bit lines BL (representing BL1 to BL$m$), and source lines SL (representing SL1 to SL$m$) as well as MOS transistors QA (representing QA1 to QA$m$), QB (representing QB1 to QB$m$), QC (representing QC1 to QC$m$), and QD (representing QD1 to QD$m$). In the write operation for writing data "0", both the row-select signal line WL and the column-select signal line YS are set to a high level, and the MOS transistors QM, QA, and QB are turned on, thus selecting a specific memory cell subjected to the write operation. Herein, a write current (whose value satisfies the write operation) flows through a virtual ground line VSL from a write driver WD, thus increasing the resistance of the resistor RM.

The write operation for writing data "1" is performed inversely to the write operation for writing data "0", wherein a write current flows through the virtual ground line VSL towards the write driver WD, thus decreasing the resistance of the resistor RM.

In the read operation, both the row-select signal line WL and the column-select signal line YS are set to a high level so as to select a specific memory cell subjected to the read operation. Herein, a read amplifier RA performs amplification and comparison between a detection current value flowing through the virtual ground line VSL via an I/O line and a reference current value so as to assess the resistance of the resistor RM; that is, it makes a decision as to whether or not the detection current value is smaller than the reference current value (when the resistor RM has a high resistance) or whether or not the detection current value is higher than the reference current value (when the resistor RM has a low resistance).

In FIG. 3, a line VDL supplies a precharge voltage between the bit line BL and the source line SL. When the MOS transistors QC and QD are turned on by way of the line VDL (where a line PC has a high level), the MOS transistors connected with the bit line BL and the source line SL is turned on before the read operation, so that the memory cell is retained at the same potential as the bit line BL and the source line SL and is thus subjected to precharge.

After the precharge, the line PC is set to a low level so as to turn off both the MOS transistors QC and QD, thus placing both the bit line BL and the source line SL in a floating state relative to the line VDL. Herein, the MOS transistors QM are turned off so as to prevent currents from flowing through the memory cells MC connected with the same bit line BL and the same source line SL as the specific memory cell MC which is selected by the row-select signal line WL and the column-select signal line YS, thus protecting their data from being unexpectedly read and changed.

A row decoder 8n (representing 81 to 84) decodes an input row address so as to selectively activate the row-select signal lines WL. A column decoder 7n (representing 71 to 74) decodes an input column address so as to selectively activate the column-select signal lines YS.

Each memory cell MC is capable of reading and reloading data within several tens of nano-seconds, wherein it differs from the conventionally-known flash memory in that data thereof is not necessarily erased before reloading, and it does not need write verification; hence, it can be used as a random-access memory serving as a work area. As described above, the memory cells MC included in the nonvolatile RAM of the present embodiment do not need to temporarily erase previous data when writing new data therein; hence, they can be subjected to random access allowing data to be read therefrom and written therein in response to random address.

In FIG. 4, diffusion layers regarding sources, drains, and gate electrodes are sequentially formed on a substrate 100 so as to form the MOS transistors QA, QB, QC, QD, and QM. In addition, wiring layers regarding the column-select signal lines YS, row-select signal lines WL, bit lines BL, and source lines SL as well as the lines VDL and PC are formed by way of interlayer insulating films.

Specifically, the variable resistor RM is formed between the bit line BL (i.e., BLm) and a plug Pm connected to the drain of the MOS transistor QM.

3. Write Characteristics of Variable Resistor RM

Figure 5A:
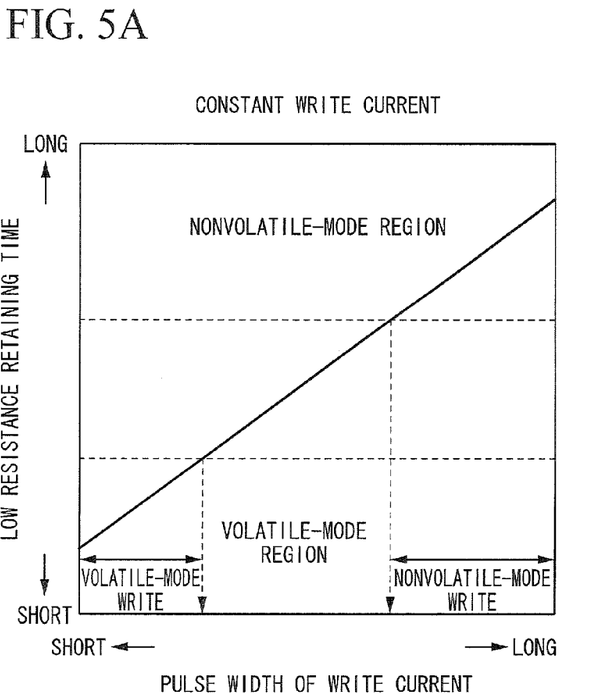
FIG. 5A is a graph showing write characteristics of a variable resistor included in each memory cell, in which a constant write current is applied to the variable resistor while a write time thereof is varied.
Figure 5B:
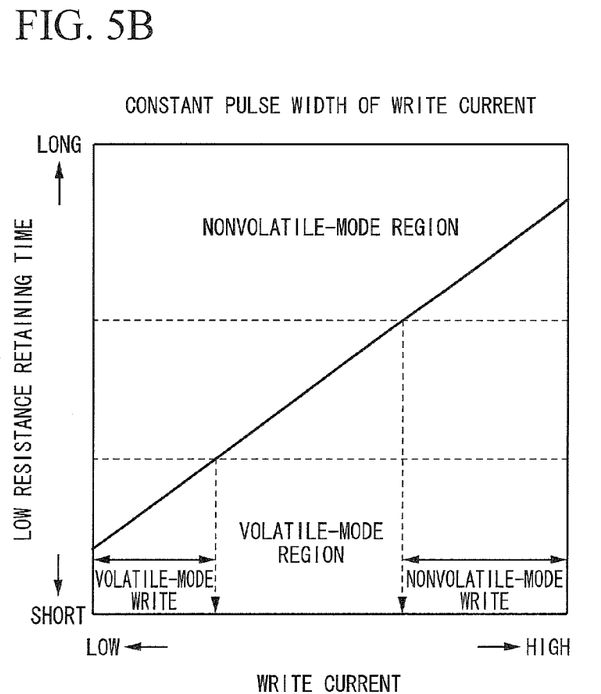
FIG. 5B is a graph showing write characteristics of a resistor included in each memory cell, in which a write current whose value is varied is applied to the resistor with a constant time.

Write characteristics of the variable resistors RM will be described with reference to FIGS. 5A and 5B. FIG. 5A is a graph showing that a fixed write current is applied to the resistor RM while the write time thereof is varied, wherein the horizontal axis represents the write time of a write current (in other words, the pulse width of a write current), and the vertical axis represents a low resistance retained time of the variable resistor RM (in other words, a data retaining time). FIG. 5B is a graph showing that a write current whose value is varied is applied to the resistor RM with a fixed write time, wherein the horizontal axis represents the value of the write current, and the vertical axis represents the low resistance retaining time of the resistor RM (i.e., the data retaining time).

FIG. 5A clearly shows that the memory cell accepts the volatile-mode write operation as the write time of the write current decreases, wherein the resistance of the resistor RM temporarily decreases due to the write operation but it gradually increases after the lapse of a certain write time; this makes it difficult to detect data.

As the write time increases, the time for increasing the resistance of the resistor RM becomes long so as to improve data-retaining ability. When the write time of the write current applied to the resistor RM exceeds a certain write time, the memory cell accepts the nonvolatile-mode write operation, in which a data-retaining time becomes long. The present embodiment defines the nonvolatile-mode write operation in which the resistor RM retains data for a longer period of time than a predetermined data-retaining time, and it defines the volatile-mode write operation in which the resistor RM does not retain data for a shorter period of time than the predetermined data-retaining time.

FIG. 5B clearly shows that the memory cell accepts the volatile-mode write operation as the write current decreases, wherein the resistance of the resistor RM temporarily decreases due to the write operation but it gradually increases after the lapse of a certain write time; this makes it difficult to detect data.

As the value of the write current increases, the time for increasing the resistance of the resistor RM becomes long so as to improve data-retaining ability. When the write current applied to the resistor RM exceeds a certain value, the memory cell accepts the nonvolatile-mode write operation, in which a data-retaining time becomes long.

That is, a transition occurs between the volatile-mode write operation and the nonvolatile-mode write operation in response to the value and write time of the write current applied to the resistor RM. In other words, the write characteristics regarding either the volatile mode or the nonvolatile mode depends upon the amount of electric charge applied to the resistor RM.

4. Write Circuit of Variable Resistor RM

Figure 6A:
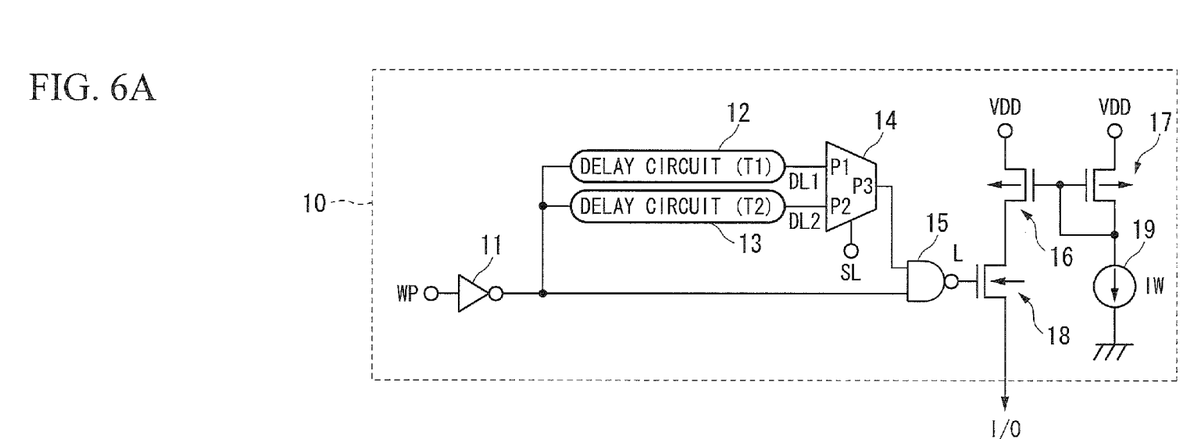
FIG. 6A is a circuit diagram showing the constitution of a write circuit for generating write pulses.

FIG. 6A shows the circuit constitution of a write circuit (or a write driver) 10 for writing data into the resistor RM included in the memory cell MC controlled by the memory array control section 7. The write circuit 10 generates pulses of a write current applied to the resistor RM.

The write circuit 10 includes an inverter (or a NOT circuit) 11, delay circuits 12 and 13 (having delay times T1 and T2), a selector 14, a NAND circuit 15, P-channel MOS transistors 16 and 17, an N-channel MOS transistor 18, and a constant current source 9 (generating a constant current Iw).

The write circuit 10 performs a write operation in response to a write instruction output from the input/output circuit 2. Upon receipt of a nonvolatile-mode write signal from the control circuit 6, the write circuit 10 performs the nonvolatile-mode write operation. Without reception of the nonvolatile-mode write signal, the write circuit 10 performs the volatile-mode write operation. Upon reception of a write-protect signal from the control circuit 6, the write circuit 10 stops performing the write operation.

The delay circuits 12 and 13 directly provide the trailing edges of input pulses while the leading edges are delayed by the delay times T1 and T2, thus outputting delayed signals DL1 and DL2.

The selector 14 selectively outputs one of the delayed signals DL1 and DL2 input to input terminals P1 and P2 from an output terminal P3. When a select signal SL has a high level, the selector 14 outputs the delayed signal DL1 input to the input terminal P1 from the output terminal P3. When the select signal SL has a low level, the selector 14 outputs the delayed signal DL2 input to the input terminal P2 from the output terminal P3. Upon reception of the nonvolatile-mode write signal, the write circuit 10 sets the select signal SL to the low level. Without reception of the nonvolatile-mode write signal, the write circuit 10 sets the select signal SL to the high level.

The NAND circuit 15 performs a NAND operation on the output signal of the inverter 11 and the output signal of the selector 14 (from the output terminal P3), so that the result of the NAND operation is supplied to the gate of the MOS transistor 18.

When turned on, the MOS transistor 18 allows a write current (or a pulse) applied to the drain thereof to flow toward the I/O line (see FIG. 3) via the source thereof.

The write current flows through the MOS transistor 16 in proportion to the constant current Iw, which flows through the MOS transistor 17 by means of the constant current source 19, by way of a current mirror circuit constituted of the MOS transistors 16 and 17 and the constant current source 19.

Figure 6B:
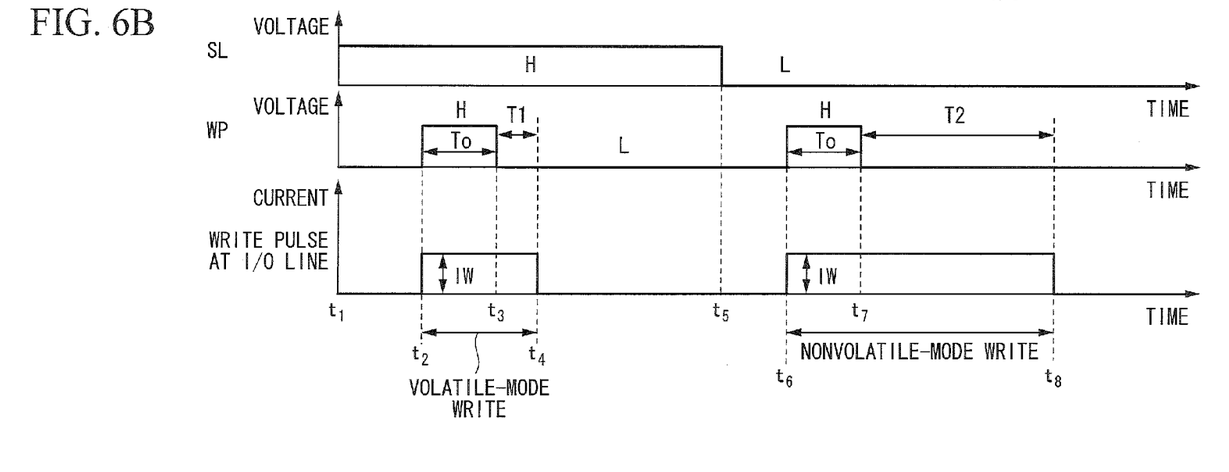
FIG. 6B is a time chart for explaining a write operation in response to the volatile mode and the nonvolatile mode.

FIG. 6B is a time chart showing the write operation of the write circuit 10 (see FIG. 6A) with regard to the resistor RM.

In a period between times t1 and t5, the select signal SL is set to a high level so that the selector 14 outputs the delayed signal DL1 (which is output from the delay circuit 12 and is then input to the input terminal P1) from the output terminal P3 in conformity with the volatile mode.

After the time t5, the select signal SL is set to a low level so that the selector 14 outputs the delayed signal DL2 (which is output from the delay circuit 13 and is then input to the input terminal P2) from the output terminal P3 in conformity with the nonvolatile mode.

That is, in response to the delayed signal DL1 or DL2 that is selected responsive to the select signal SL, the write circuit 10 performs either the volatile-mode write operation or the nonvolatile-mode write operation in connection with the resistor RM.

In a period between times t1 and t2, the inverter 11 receives a low-level signal so as to output a high-level signal to the delay circuits 12 and 13 as well as a first input terminal of the NAND circuit 15.

In this period, the selector 14 does not receive a delayed signal; hence, it outputs a high-level signal to a second terminal of the NAND circuit 15.

Upon reception of the high-level signals at the first and second input terminals, the NAND circuit 15 outputs a low-level signal to the gate of the MOS transistor 18.

Upon reception of the low-level signal at the gate, the MOS transistor 18 is turned off (indicating a non-conduction state) so that it blocks the write current applied to the drain from being output from the source thereof.

At the time t2, the memory array control section 7 outputs a write pulse WP having a pulse width T0 retaining a high level in response to a write instruction given from an external device (not shown).

Upon reception of the write pulse WP, the inverter 11 outputs a low-level inversion signal to the delay circuits 12 and 13 as well as the first input terminal of the NAND circuit 15. Upon reception of the low-level inversion signal, both the output signals of the delay circuits 12 and 13 are turned to the low level from the high level.

At this time, the selector 14 selects the input terminal P1 so as to output the delayed signal DL1 (output from the delay circuit 12) from the output terminal P3.

Upon reception of the low-level signals at the first and second input terminals, the NAND circuit 15 outputs a high-level signal to the gate of the MOS transistor 18.

Thus, the MOS transistor 18 allows the write current (applied to the drain) to flow toward the I/O line via the source thereof. That is, the write current is supplied to the resistor RM selected by the designated address, thus starting the write operation therefor.

At time t3 after the time T0 corresponding to the pulse width T0, the write pulse WP turns from the high level to the low level; hence, the inverter 11 turns the output signal thereof from the low level to the high level.

That is, the inverter 11 outputs a high-level inversion signal to the delay circuits 12 and 13 as well as the first input terminal of the NAND circuit 15. Upon reception of the high-level inversion signal, the delay circuit 12 retains the delayed signal DL1 at a low level within the delay time T1 following the time T0.

At this time, the NAND circuit 15 receives the high-level inversion signal from the inverter 11 at the first input terminal thereof, while it still receives the low-level signal from the selector 14 at the second input terminal thereof. Hence, the NAND circuit 15 still retains the high-level output signal thereof. Since the high-level output signal of the NAND circuit 15 is continuously supplied to the gate of the MOS transistor 18, the MOS transistor 18 maintains the write current applied to the drain to continuously flow toward the I/O line from the source thereof.

At time t4 after the time T1 elapses from the time t3, the delay circuit 12 stops performing the delay operation so as to turn the delayed signal DL from the low level to the high level.

Since both the first and second input terminals receive the high-level signals, the NAND circuit 15 turns the output signal thereof to the low level.

Upon reception of the low-level output signal from the NAND circuit 15 at the gate, the MOS transistor 18 is turned off (indicating a non-conduction state) so as to block the write current applied to the drain from being output from the source thereof.

As described above, in the period between the times t2 and t4, the write current is continuously supplied to the resistor RM, so that a prescribed amount of electric charge is supplied to the resistor RM in response to the time and value of the write current in accordance with the volatile-mode write operation.

In contrast, the nonvolatile-mode write operation is performed with respect to the resistor RM in the period between times t5 and t8. In this period, the select signal SL is set to the low level; hence, the selector 14 selects the input terminal P2 so as to output the delayed signal DL2 (output from the delay circuit 13) from the output terminal P3.

Within the time T0 (corresponding to the pulse width T0 of the write pulse WP) and the delay time T2 (where T2>T1) ranging from time t7 (corresponding to the trailing-edge timing of the write pulse WP) to time t8, the MOS transistor 18 is continuously turned on so as to enable the nonvolatile-mode write operation.

As a result, within the period between time t6 (corresponding to the leading-edge timing of the write pulse WP) and time t8, the write current is continuously supplied to the resistor RM; hence, a prescribed amount of electric charge is supplied to the resistor RM in response to the time and value of the write current in accordance with the nonvolatile-mode write operation.

The write circuit 10 of FIG. 6A is designed to output a constant write current onto the I/O line, wherein a prescribed amount of electric charge is supplied to the resistor RM in a period that is variable dependent on the volatile mode and the nonvolatile mode, in other words, in a period corresponding to a pulse width of a write pulse that is variable dependent on the volatile mode and the nonvolatile mode. The constitution of the write circuit 10 of FIG. 6A is not a restriction; hence, it is possible to use another constitution as long as it guarantees the aforementioned function.

Figure 7A:
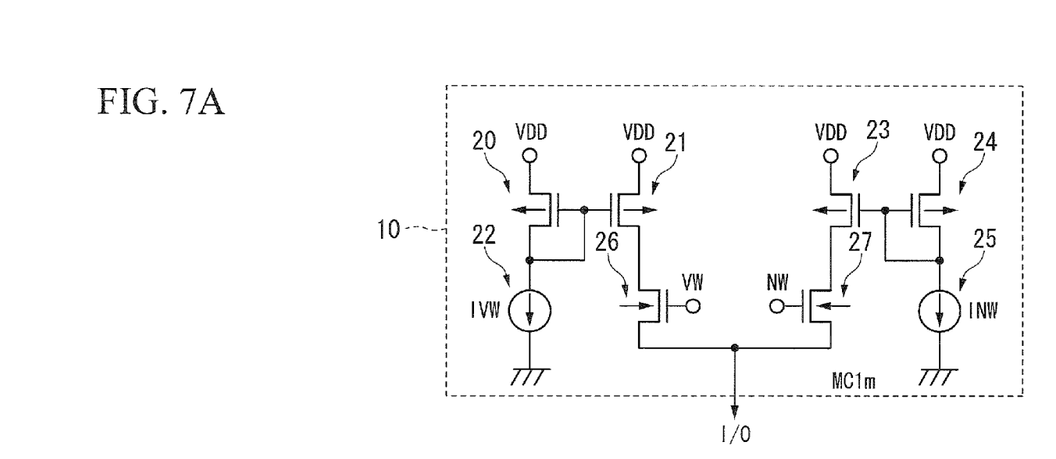
FIG. 7A is a circuit diagram showing another constitution of the write circuit for generating write pulses.

FIG. 7A shows another constitution of the write circuit 10, which is designed to output write currents having different values onto the I/O line, wherein a prescribed amount of electric charge supplied to the resistor RM is controlled by use of a predetermined pulse width of a write pulse, thus controlling it in response to the volatile mode and the nonvolatile mode respectively.

The write circuit 10 of FIG. 7A includes P-channel MOS transistors 20, 21, 23, and 24, N-channel MOS transistors 26 and 27, and constant current sources 22 and 25.

Figure 7B:
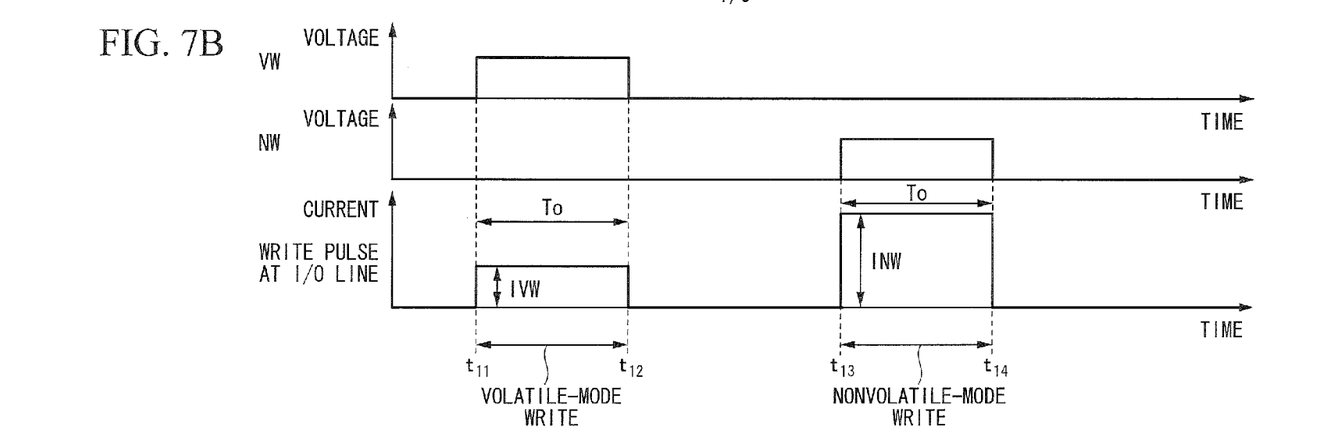
FIG. 7B is a time chart for explaining the write operation in response to the volatile mode and the nonvolatile mode.

FIG. 7B is a time chart showing the write operation of the write circuit 10 of FIG. 7A. As shown in FIG. 7B, the write circuit 10 of FIG. 7A is designed to set a predetermined pulse width T0 for a write current whose value depends upon the volatile mode and the nonvolatile mode respectively, thus supplying different amounts of electric charge to the resistor RM in response to the volatile mode and the nonvolatile mode respectively.

Specifically, the write circuit 10 of FIG. 7A outputs a write pulse VW to the variable resistor RM in the volatile-mode write operation, while it outputs a write pulse NW in the nonvolatile-mode write operation, wherein both the write pulses VW and NW have the same pulse width T0. Upon reception of a nonvolatile-mode write signal from the control circuit 6, the write circuit 10 outputs a high-level write pulse NW. Without reception of the nonvolatile-mode write signal, the write circuit 10 outputs a high-level write pulse VW.

In the write circuit 10 of FIG. 7A, the MOS transistor 26 is supplied with a write current (whose value is IVW) output from a current mirror circuit (constituted of the MOS transistors 20 and 21 and the constant current source 22) at the drain thereof, wherein the source thereof is connected to the I/O line, and the gate thereof is connected to a signal line for transmitting the write pulse VW.

The MOS transistor 27 is supplied with a write current (whose value is INW) output from a current mirror circuit (constituted of the MOS transistors 23 and 24 and the constant current source 25) at the drain thereof, wherein the source thereof is connected to the I/O line, and the gate thereof is connected to a signal line for transmitting the write pulse NW.

In the above, IVW<INW, wherein the write circuit 10 of FIG. 7A produces the write current in a prescribed period corresponding to the pulse width T0 (which remains the same irrespective of the volatile mode and the nonvolatile mode) so as to supply a prescribed amount of electric charge to the resistor RM. Compared with the write circuit 10 of FIG. 6A, the write circuit 10 of FIG. 7A needs two constant current sources 22 and 25 with respect to the volatile mode and the nonvolatile mode respectively, whereas it is advantageous in that the same write time be applied to both the volatile mode and the nonvolatile mode; this makes it possible to perform random access control with ease.

In FIG. 7B, the period T0 lies between times t11 and t12 in connection with the volatile-mode write operation, and the same period T0 lies between times t13 and t14 in connection with the nonvolatile-mode write operation.

As described above, the write circuit 10 of FIG. 7A is designed to set the same period T0, i.e., the same pulse width T0 for the write current, irrespective of the volatile mode and the nonvolatile mode, wherein the value of the write current is appropriately set in response to the volatile mode and the nonvolatile mode respectively, so that the necessary amount of electric charge is applied to the resistor RM.

In the volatile-mode write operation, the necessary amount of electric charge applied to the resistor RM is determined based on a refresh time, wherein in consideration of the setting of the same pulse width T0, the value of the write current is appropriately set up so as to realize a prescribed amount of electric charge satisfying the refresh time in the volatile mode.

5. Applied Examples of Nonvolatile RAM

Next, applied examples of the nonvolatile RAM 1 of the present embodiment applied to portable small-size electronic devices will be described with reference to FIGS. 8A to 8D, which are sectional views showing constitutions of nonvolatile RAMs packaged with electronic devices.

Figure 8A:
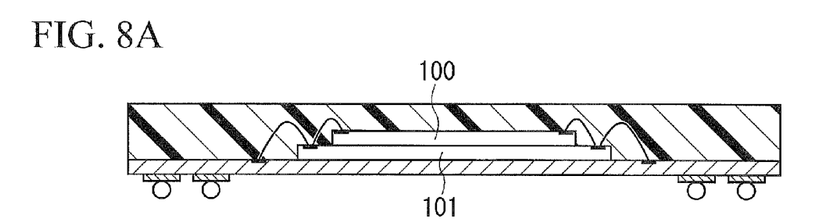
FIG. 8A is a first applied example of a nonvolatile RAM joining an LSI chip of a processor in a portable small-size electronic device in accordance with SIP.
Figure 8B:
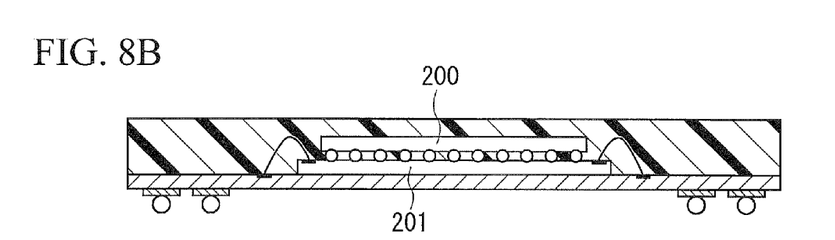
FIG. 8B is a second applied example of a nonvolatile RAM joining an LSI chip of a processor in a portable small-size electronic device in accordance with SIP.
Figure 8C:
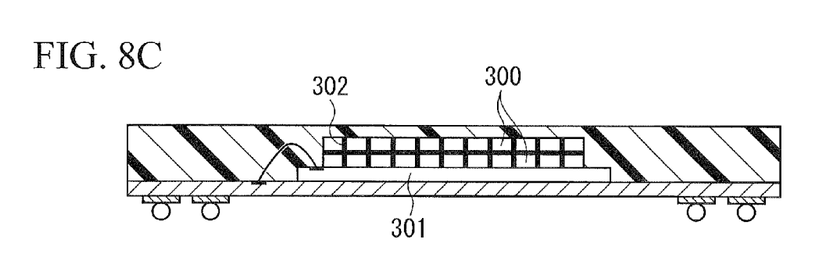
FIG. 8C is a third applied example of nonvolatile RAMs joining an LSI chip of a processor via silicon through-holes in a portable small-size electronic device in accordance with SIP.

The constitutions shown in FIGS. 8A, 8B, and 8C are each designed as a single package in which a nonvolatile RAM joins a processor of an LSI chip in accordance with SIP (System In a Package).

Specifically, FIG. 8A shows that a nonvolatile RAM 100 joins an LSI chip 101, in which electrode pads are electrically connected to a substrate via bonding wires, so that they are encapsulated in a single package. FIG. 8B shows that a nonvolatile RAM chip 200 joins an LSI chip 201 via electrode pads, which are connected together via micro solder balls, so that they are encapsulated in a single package. FIG. 8C shows that multiple nonvolatile RAM chips 300 are laminated together in such a way that they are connected together via silicon through-holes 302, by which they join electrodes of an LSI chip 301, so that all of them are encapsulated in a single package.

Figure 8D:
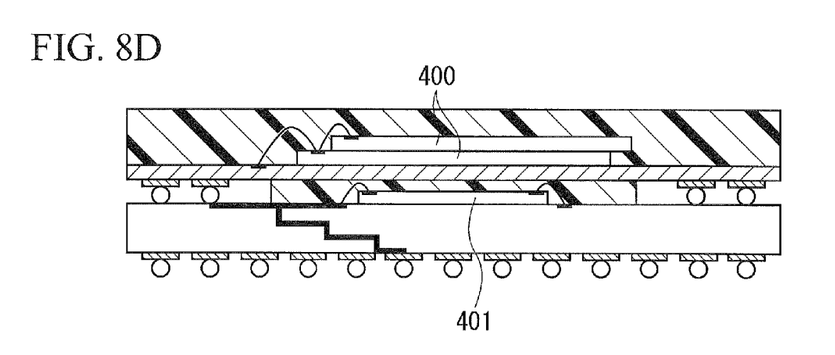
FIG. 8D is a fourth applied example of nonvolatile RAMs joining an LSI chip of a processor in a portable small-size electronic device in accordance with POP.

FIG. 8D shows an example of the POP (Package On a Package) structure, in which a package including two large-capacity nonvolatile RAMs 400 is combined with a package of a processor 401 so as to form a single package including electronic parts.

Due to the aforementioned methods for packaging nonvolatile RAMs and LSI chips as shown in FIGS. 8A to 8D, it is possible to reduce the total packaging area of the nonvolatile RAM and the LSI chip on the board. This makes it possible to remarkably reduce the size and the manufacturing cost with respect to portable small-size electronic devices such as cellular phones.

6. Another Applied Example of Nonvolatile RAM

Figure 9:
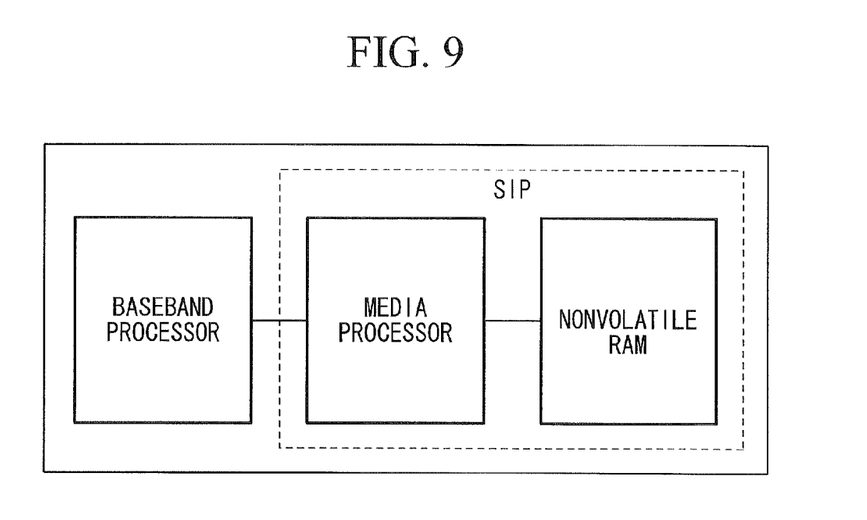
FIG. 9 is block diagram showing the basic constitution of a cellular phone applied with the nonvolatile RAM of the present invention.

FIG. 9 is a block diagram diagrammatically showing that the nonvolatile RAM of the present embodiment is applied to a cellular phone.

That is, the nonvolatile RAM of the present embodiment is combined with a media processor in a single package as shown in FIGS. 8A to 8C in accordance with SIP, which is further combined with a baseband processor so as to form the system for a cellular phone.

In FIG. 9, the nonvolatile RAM and the LSI chip (corresponding to the media processor) are encapsulated in a single package, which is then packaged with the baseband processor. This simplifies the system constitution on the board, which can be thus reduced in size. Thus, it is possible to reduce the manufacturing cost and to reduce the scale of the system.

Lastly, the present invention is not necessarily limited to the present embodiment and its variations, which can be further modified in a variety of ways within the scope of the invention as defined by the appended claims.

What is claimed is:

1. A semiconductor random access memory device comprising:
   a memory cell including a resistor whose resistance varies by way of the formation and disappearance of a filament due to an oxidation-reduction reaction of metal ions;

a memory area configured to include a first memory area operable in a nonvolatile mode in which a stored content thereof is not lost by a power-off event, and a second memory area operable in a volatile mode in which the stored content thereof is lost by the power-off event, each of the first memory area and the second memory area including a plurality of memory cells including the memory cell;

a register circuit that stores information including a first address information indicating the first memory area, and a second address information indicating the second memory area; and a control circuit that controls the nonvolatile mode, and the volatile mode, with reference to the information stored in the register circuit.

2. The semiconductor random access memory device according to claim 1, wherein the control circuit is capable to rewrite the stored data in the plurality of the memory cells of the second memory area.

3. The semiconductor random access memory device according to claim 1, wherein each of the memory cells includes a transistor wherein the transistor is coupled to both the resistor and a word line.

4. The semiconductor random access memory device according to claim 1, further comprising a write protection area setting register that stores write protection area information to prevent from rewriting.

5. The memory device according to claim 4, wherein the transistor and the resistor coupled in series.

6. The semiconductor random access memory device according to claim 1, wherein the resistor comprises:
a solid electrolyte having a resistance which varies due to a current flowing therethrough; and
first and second electrodes, the solid electrolyte being formed between the first and second electrodes.

7. The semiconductor random access memory device according to claim 6, wherein if a first voltage is applied between the first and second electrodes, then a metal bridge is formed in the solid electrolyte such that the resistor has a first resistance, and
wherein if a second voltage different from the first voltage is applied between the first and second electrodes, a metal bridge is not formed in the solid electrolyte such that the resistor has a second resistance which is greater than the first resistance.

8. The semiconductor random access memory device according to claim 1, further comprising:
a plurality of bit lines; and
a metal oxide semiconductor (MOS) transistor, the resistor being formed between a drain of the MOS transistor and a bit line of the plurality of bit lines.

9. The semiconductor random access memory device according to claim 8, wherein the memory cell further comprises:
a substrate, the drain of the MOS transistor being formed in the substrate;
an interlayer insulating film formed on the substrate; and
a plug which is formed in the interlayer insulating film, and on the drain of the MOS transistor, the resistor being formed between the plug and the bit line.

10. A memory device comprising:
a resistive-type memory cell including a resistor comprising a first electrode, a second electrode different form the first electrode and a solid electrolyte sandwiched between the first and second electrodes;
a memory area configured to include a first memory area operable in a nonvolatile mode in which a stored content thereof is not lost by a power-off event, and a second memory area operable in a volatile mode in which the stored content thereof is lost by the power-off event, each of the first memory area and the second memory area including a plurality of resistive-type memory cells including the resistive-type memory cell;

a register circuit that stores information including a first address information indicating the first memory area, and a second address information indicating the second memory area; and a control circuit that controls the nonvolatile mode, and the volatile mode, with reference to the information stored in the register circuit.

11. The memory device according to claim 10, wherein the control circuit is capable to rewrite the stored data in the plurality of the resistive-type memory cells of the second memory area.

12. The memory device according to claim 10, wherein each of the resistive-type memory cells includes a transistor coupled to the resistor and the transistor including a control terminal coupled to a word line.

13. The memory device according to claim 10, further comprising a write protection area setting register that stores write protection area information to prevent the memory area identified by the information from rewriting.

14. The memory device according to claim 12, wherein the transistor and the resistor are coupled in series.

15. The memory device according to claim 10, wherein the first electrode includes a material causing oxidation reaction between the first electrode and the solid electrolyte, and the second electrode includes a material causing oxidation reduction reaction between the second electrode and the solid electrolyte.

16. A memory device comprising:
a plurality of memory cells, each of the plurality of memory cells including a resistor whose resistance varies by way of the formation and disappearance of a filament due to an oxidation-reduction reaction of metal ions;
a memory area configured to include a first memory area operable in a nonvolatile mode in which a stored content thereof is not lost by a power-off event, and a second memory area operable in a volatile mode in which the stored content thereof is lost by the power-off event, each of the first memory area and the second memory area including the plurality of memory cells;
a register circuit that is capable to store at least one of a first memory area information indicating the first memory area and a second area information indicating the second memory area; and
a control circuit configured to perform the nonvolatile mode when an address in response to a write operation designates the nonvolatile memory area, and the volatile mode when an address in response to the write operation designates the volatile memory area.

17. The memory device according to claim 16, wherein the control circuit is capable to rewrite the stored data in the plurality of memory cells of the second memory area.

18. The memory device according to claim 16, wherein each of the memory cells includes a transistor coupled to the resistor and the transistor including a control terminal coupled to a word line.

19. The memory device according to claim 16, further comprising a plurality of bit lines and a plurality of lines, the transistor and the resistor coupled in series between one of the plurality of bit lines and one of the plurality of lines.

20. A memory device comprising:
a plurality of resistive-type memory cells, each of the plurality of resistive-type memory cells including a first electrode, a second electrode different form the first electrode and a solid electrolyte sandwiched between the first and second electrodes;
a memory area configured to include a first memory area operable in a nonvolatile mode in which a stored content thereof is not lost by a power-off event, and a second memory area operable in a volatile mode in which the stored content thereof is lost by the power-off event, each of the first memory area and the second memory area including the plurality of resistive-type memory cells;
a register circuit that is capable to store at least one of first memory area information indicating the first memory area and second memory area information indicating the second memory area; and
a control circuit configured to perform the nonvolatile mode when an address in response to a write operation designates the first memory area, and the volatile mode when an address in response to the write operation designates the second memory area.

21. The memory device according to claim 20, wherein the control circuit is capable to rewrite the stored data in the plurality of resistive-type memory cells of the second memory area.

22. The memory device according to claim 20, wherein each of the resistive-type memory cells includes a transistor coupled to the resistor and the transistor including a control terminal coupled to a word line.

23. The memory device according to claim 20, further comprising a plurality of bit lines and a plurality of lines, the transistor and the resistor coupled in series between one of the plurality of bit lines and one of the plurality of lines.

24. The memory device according to claim 20, wherein the first electrode includes a material causing oxidation between the first electrode and the solid electrolyte when a specific voltage applies between the first and second electrodes, and the second electrode includes a material causing reduction between the second electrode and the solid electrolyte when the specific voltage applies between the first and second electrodes.

* * * * *